United States Patent
Paller et al.

(10) Patent No.: US 12,484,154 B2
(45) Date of Patent: Nov. 25, 2025

(54) INLAY WITH EXPOSED POROUS LAYER, COMPONENT CARRIER AND MANUFACTURING METHODS

(71) Applicant: AT&S Austria Technologie & Systemtechnik AG, Leoben (AT)

(72) Inventors: Stefanie Paller, Fernitz-Mellach (AT); Gernot Grober, Weisskirchen (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 351 days.

(21) Appl. No.: 18/188,401

(22) Filed: Mar. 22, 2023

(65) Prior Publication Data
US 2023/0309236 A1    Sep. 28, 2023

(30) Foreign Application Priority Data

Mar. 23, 2022   (EP) .................................... 22163907

(51) Int. Cl.
*H05K 1/02*    (2006.01)
*H05K 1/03*    (2006.01)
(Continued)

(52) U.S. Cl.
CPC ........... *H05K 1/185* (2013.01); *H05K 1/0272* (2013.01); *H05K 1/0313* (2013.01);
(Continued)

(58) Field of Classification Search
CPC ...... B01D 69/10; H04R 1/083; H04R 31/003; H04R 7/02; H05K 1/0272; H05K 1/0313; H05K 1/183; H05K 1/184; H05K 1/185; H05K 1/02; H05K 1/03; H05K 1/18; H05K 2201/0116; H05K 2201/09072; H05K 2201/0949; H05K 2201/09827;
(Continued)

(56) References Cited

U.S. PATENT DOCUMENTS 6,020,049 A    2/2000   Cucinotta
2001/0018799 A1    9/2001   Lauffer et al.
(Continued)

FOREIGN PATENT DOCUMENTS

DE    202004020336 U1 *  6/2005  ......... H01L 21/6831
EP    3820258 A1    5/2021
JP    2002214190 A *  7/2002  ............... C12N 9/02

OTHER PUBLICATIONS

Polytetrafluoroethylene—Wikipedia—pp. 1-16_Jan. 2022.*
(Continued)

*Primary Examiner* — Timothy J Thompson
*Assistant Examiner* — Guillermo J Egoavil
(74) *Attorney, Agent, or Firm* — Robert A. Blaha; Smith Tempel Blaha LLC (57) ABSTRACT

An inlay for a component carrier includes a gas-permeable porous layer structure, an upper layer structure, arranged on the gas-permeable porous layer structure, the upper layer structure defining a cavity such that a portion of the gas-permeable porous layer structure is exposed and an upper metal layer structure arranged on the upper layer structure. A component carrier with the inlay and manufacturing methods of the inlay and the component carrier are described.

19 Claims, 2 Drawing Sheets

(51) Int. Cl.
  *H05K 1/18* (2006.01)
  *H05K 3/00* (2006.01)
  *H05K 3/46* (2006.01)
(52) U.S. Cl.
  CPC ......... *H05K 3/0058* (2013.01); *H05K 3/4697*
    (2013.01); *H05K 2201/09072* (2013.01); *H05K*
    *2201/0949* (2013.01); *H05K 2201/09827*
    (2013.01); *H05K 2201/10962* (2013.01)
(58) Field of Classification Search
  CPC ....... H05K 2201/10962; H05K 3/0058; H05K
    3/4697; H05K 3/00; H05K 3/46
  USPC ......................................................... 361/761
  See application file for complete search history.

(56) References Cited

U.S. PATENT DOCUMENTS

| | | | |
|---|---|---|---|
| 2006/0120016 A1* | 6/2006 | Feichtinger | H01C 7/18 361/306.3 |
| 2011/0076448 A1 | 3/2011 | Agarwal et al. | |
| 2011/0143114 A1 | 6/2011 | Horie et al. | |
| 2011/0205688 A1* | 8/2011 | Ray | H01G 11/86 977/750 |
| 2012/0193285 A1 | 8/2012 | Nagai et al. | |
| 2018/0070158 A1 | 3/2018 | Watson et al. | |
| 2020/0163218 A1* | 5/2020 | Mok | H05K 3/4038 |

OTHER PUBLICATIONS

Degroote, B.; Partial European Search Report in Application 22 16 3907.3; pp. 1-16; Mar. 13, 2023; European Patent Office, 80298, Munich, Germany.

Degroote, B.; Partial European Search Report in Application 22 16 3907.3; pp. 1-15; Dec. 23, 2022; European Patent Office, 80298, Munich, Germany.

Degroote, B.; Invitation Pursuant to Rule 62a(1) EPC and Rule 63(1) EPC in Application 22 163 907.3; pp. 1-6; Oct. 5, 2022; European Patent Office, 80298, Munich, Germany.

\* cited by examiner

INLAY WITH EXPOSED POROUS LAYER, COMPONENT CARRIER AND MANUFACTURING METHODS

CROSS-REFERENCE TO RELATED APPLICATIONS

This application claims the benefit of the filing date of European Patent Application No. 22163907.3, filed on Mar. 23, 2022, the disclosure of which is hereby incorporated herein by reference.

TECHNICAL FIELD

Embodiments disclosed herein relate to an inlay for a component carrier, a component carrier, and methods of manufacturing an inlay and the component carrier, respectively.

BACKGROUND ART

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. Also, an efficient protection against electromagnetic interference (EMI) becomes an increasing issue. At the same time, component carriers shall be mechanically robust and electrically and magnetically reliable so as to be operable even under harsh conditions.

In particular, providing specific functionalities within a component carrier may be considered a challenge. EP 3 820 258 A1 describes a component carrier with an exposed layer, whereby the exposed layer is manufactured together with the component carrier in one and the same process.

SUMMARY

There may be a need to provide specific functionalities within a component carrier in a reliable and design-flexible manner.

An inlay, a component carrier, a method of manufacturing the inlay, and a method of manufacturing the component carrier are provided.

According to an aspect of the disclosure, there is described an inlay for a component carrier, the inlay comprising or consisting of: i) a gas (in particular air)-permeable porous layer structure (e.g., a polytetrafluoroethylene (PTFE) layer); ii) an upper layer structure (in particular a dielectric layer structure), arranged on (in particular directly on) the gas-permeable porous layer structure, wherein the upper layer structure comprises a cavity, configured (e.g., as a blind hole) so that an upper part of the gas-permeable porous layer structure is exposed; and iii) an upper metal layer structure (in particular a copper layer), arranged on (in particular directly on) the upper layer structure.

According to a further aspect of the disclosure, there is described a component carrier, comprising: i) a stack comprising at least one electrically conductive layer structure and at least one electrically insulating layer structure; and ii) an inlay (as described above), wherein the inlay is assembled, in particular embedded in and/or surface-mounted, to the stack.

According to a further aspect of the disclosure, there is described a method of manufacturing an inlay for a component carrier, the method comprising: i) providing (forming) a gas-permeable porous layer structure; ii) arranging an upper layer structure on the gas-permeable porous layer structure; iii) forming a cavity (e.g., by photolithography, etching, or drilling) in the upper layer structure, thereby exposing an upper part of the gas-permeable porous layer structure; and iv) arranging an upper metal layer structure on the upper dielectric layer structure.

According to a further aspect of the disclosure, there is described a method of manufacturing a component carrier, the method comprising: i) forming a stack comprising at least one electrically conductive layer structure and at least one electrically insulating layer structure (e.g., a core layer structure); and ii) assembling, in particular embedding in and/or surface-mounting on, an inlay as described above to the stack.

Overview of Embodiments

In the context of the present document, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present document, the term "layer structure" may particularly denote a continuous layer, a patterned layer, or a plurality of non-consecutive islands within a common plane.

In the context of the present document, the term "gas-permeable porous layer structure" may refer to any layer structure that is (at least partially) permeable for gas, for example air (i.e., the layer may be sound permeable). To achieve this property, the layer structure may be (at least) partially porous. While the porous layer structure should be gas-permeable, in an embodiment, the porous layer structure may be impermeable for liquids (in particular water). As steam can be either treated as an ideal or real gas, the permeable porous layer structure may be permeable for steam. In an example, the porous layer structure may be configured as a membrane and/or a thin film. Furthermore, the gas-permeable porous layer structure may be configured as a membrane and may comprise open or closed structures (channels) in vertical and or horizontal direction. In an embodiment, the porous layer structure is configured as a PTFE membrane.

In the context of the present document, the term "cavity" may particularly denote an opening, a recess, or a hole in the stack which is delimited (at least partially) from at a bottom or a top side by the exposed layer and laterally by other layer structures of the inlay.

In the context of the present document, the term "exposed" may particularly denote that a layer structure is (at least) partially uncovered and partially covered by further material (of the inlay). In an example, the porous layer structure may be uncovered in surface areas of both opposing main surfaces (being parallel with the directions of main extension along the x-y plane) at a horizontally central portion of the porous layer structure. However, at the same time, the partially exposed layer structure may be covered on both opposing main surfaces further by the upper/lower layer structure.

In the context of the present document, the term "upper/lower layer structure" may refer to a layer structure that is arranged (in particular directly) on/below the porous layer structure. Said upper/lower layer structure may comprise a dielectric material, but in a specific embodiment may also contain an electrically conductive material, e.g., a metal. In the following, the term "layer structure" may be applied in particular for the upper/lower layer structure. In an embodiment, the upper/lower layer structure comprises a photo-imageable dielectric (PID) material and is configured as a bondply. In this example, the cavity may be efficiently formed by photolithography (additionally and/or alternatively, a stripping and/or drilling process may be applied). While in one example, the layer structure completely exposes a specific region of the porous layer structure below, the layer structure may be patterned in another example, so that the exposed region is partially covered by patterned layer structure material. The layer structure may be attached to the porous layer structure (membrane) and be patterned e.g., by UV-irradiation and development. The layer structure may protect the porous layer structure protected on specific areas, whereas others are accessible to the surrounding environment. The layer structure material may be used to protect the porous layer structure from moisture, oxidation and other (mechanical) effects, e.g., pressure. By this design, an airflow may go through the porous layer structure in specified regions. In an embodiment, the layer structure may further comprise adhesive properties.

In the context of the present document, the term "metal layer structure" may refer to a continuous or discontinuous metal layer, e.g., a foil, that is arranged on/below the upper/lower layer structure. The metal layer structure may have the same size/shape as the layer structure or comprise different size/shape properties. In an example, the metal layer structure covers the cavity (partially). In another example, the metal layer comprises a metal cavity to fully expose the porous layer structure.

In the context of the present document, the term "inlay" may refer to a separate component/element that is manufactured in an inlay manufacturing process being (essentially) independent from the component carrier manufacturing process. The inlay may be configured to be surface mounted on, or embedded in, said component carrier. However, the inlay may be produced, sold, and shipped completely independent of the component carrier. Nevertheless, in an embodiment, the manufacturing process of inlay and component carrier may be intertwined. The inlay may also be termed a stand-alone member and may be formed on the basis of component carrier technology, in particular on the basis of printed circuit board (PCB) technology and may be surface-mounted or embedded in a separately formed component carrier such as a PCB. However, the inlay component may also be used in conjunction with non-component carrier applications.

The inlay may be essentially shaped as a plate, meaning that it comprises two directions of main extension along the x- and y-axes (like the main surfaces) and a comparably short extension along the z-axis. In this context, the term "horizontal" may thus mean "oriented in parallel with a direction of main extension", while the term "vertical" may mean "oriented perpendicular to the directions of main extension". Hence, even if the inlay is turned around, the terms "vertical" and "horizontal" always have the same meaning. Further, the inlay may comprise different shapes, for example one of circular, rectangular, polygonal.

According to an exemplary embodiment, the disclosure may be based on the idea that specific functionalities within a component carrier may be provided in a reliable and design-flexible manner, when a gas-permeable porous layer structure (which may enable a plurality of functionalities) is arranged on (in particular sandwiched between) an upper layer structure and a metal layer structure, in form of an inlay. Such an inlay may be produced and handled independent of the component carrier (layer stack). Thereby, the manufacture and design of the functional inlay be more flexible and can be advantageously adapted to specific applications. Many advantageous architectures are enabled of a surface-mounted or embedded inlay with respect to a component carrier layer stack, in particular including further electronic component(s).

By providing the upper/lower layer structure, specific properties (e.g., airflow performance, protection against moisture/oxidation, etc.) of the porous layer structure may be tuned/adjusted. The component carrier independent manufacture process may enable several advantages, e.g., avoiding desmearing and mechanical material removal processes, less foreign material residues on the porous layer structure, cleaner material removal process, less front/back offset than after mechanical material removal, and less damage of the surrounding materials.

As will become apparent in the following, there may be a plurality of advantageous architectures that can be achieved with the inlay in a component carrier. Even though the inlay may be manufactured separately from the component carrier, established component carrier processes may be applied to produce the inlay, thereby enabling a straightforward implementation in existing component carrier production lines.

In the following, further exemplary embodiments of the inlay, the component carrier, and the methods will be explained.

According to an embodiment, a lower layer structure is arranged below the gas-permeable porous layer structure, wherein the lower layer structure comprises a further cavity, configured so that a lower part of the gas-permeable porous layer structure is exposed. In this configuration, the gas-permeable porous layer structure may be sandwiched between two (dielectric) layer structures. Thereby, an upper main surface and a lower main surface of the gas-permeable porous layer structure may be exposed. The exposed regions may be exactly opposed to each other or may be shifted with respect to the horizontal direction.

According to a further embodiment, the upper layer structure and/or the lower layer structure comprises a photo-imageable material (for example a PID material or a NIL (nanoimprint lithography)-resist. Using photo-imaging, the cavity and/or a patterning of the (dielectric) layer structure may be performed in a reliable and efficient manner. Drawbacks of other methods for cutting out a layer structure region may be overcome, such as e.g., front/back offset or resin flow.

According to a further embodiment, the photo-imageable material comprises or consists of photo-imageable dielectric, PID, material.

In the context of the present document, the term "photo-imageable dielectric layer structure" may refer to any dielectric (layer) structure that is configured to be treated (shows an effect) using photo-imaging. In particular, the term refers to a PID dielectric layer structure into which a cavity can be formed using (only) photo-imaging techniques. Preferably, a PID layer structure comprises a non-fiber enforced resin, e.g., polyimide. A base material for a PID application may include: i) thermosetting material, e.g., epoxy, BCB, phenol, ii) thermoplastic material: PI, PBO. The PID material may further comprise a photo initiator (photo sensitive agent) that may be cured by electromagnetic waves e.g., visible light and/or UV light. The PID material may be laminated on a substrate (e.g., the stack) and may then be exposed to a lithographic source via a pattern mask, wherein the pattern mask defines the to be manufactured cavities. Additionally and or alternatively, the PID material may be applied by other techniques e.g., spraying, spin coating, and/or slit coating. A portion of the PID material may be developed (exposed to electromagnetic waves) and one of an exposed portion and an unexposed portion (positive or negative photolithography may be used) may be removed to obtain a plurality of cavities. Examples of photolithography processes may include X-ray lithography, UV lithography, stereo lithography, e-beam lithography, and laser lithography.

According to a further embodiment, the photo-imageable material comprises advanced adhesion properties (said adhesion properties may be created be the PID material and/or by adhesion promoting additives). This may provide the advantage that the layer structure may stick to the porous layer structures in an efficient and stable manner. Further, the metal layer structure may be reliably attached to such an adhesive layer structure. This may provide a particular advantage, because copper/resin interfaces tend to be unstable regarding adhesion, in particular if no additional surface roughing is provided. Further, the adhesion may promote a stable connection with component carrier material.

According to a further embodiment, the photo-imageable material comprises or consists of a polymer, in particular a mixture of polymers. This may provide the advantage that adhesion properties may be enhanced, particularly by hydrophobic interaction of polymer(s).

According to a further embodiment, the photo-imageable material comprises or consists of photo-imageable dielectric, PID, material the photo-imageable material comprises additives, in particular conjugated pi systems.

The term "conjugated pi system" may refer to a system of connected p-orbitals with delocalized electrons in a molecule, which in general lowers the overall energy of the molecule and increases stability. Examples of such systems may include aromatic (in particular heterocycles), non-aromatic, and anti-aromatic compounds. Specific examples may include nitrogen-compounds (in particular imidazole), phosphorus-compounds, oxygen compounds, or sulfur-compounds.

According to a further embodiment, the photo-imageable material is configured as a highly temperature stable material, in particular temperature stable up to at least 250° C. Thus, the material is essentially stable at component carrier processes that may include high temperatures, for example lamination processes that require high temperature and/or pressure.

According to a further embodiment, the photo-imageable material is sensitive to electromagnetic wave radiation, e.g., UV radiation. Thus, a selective standard procedure may be efficiently applied to remove a part of the photo-imageable material accurately.

According to a further embodiment, the photo-imageable material comprises or consists of a negative or positive material (a negatively-charged material or a positively-charged material).

According to a further embodiment, the photo-imageable curing temperature is in the range of 100° C. to 300° C., in particular 150° C. to 250° C.

The above identified properties may be especially advantageous when using PCB-manufacture based processes.

According to a further embodiment, the photo-imageable material comprises a peel strength of 200 gf/cm or more, in particular in the range 200 gf/cm to 1500 gf/cm, more in particular in the range of 500 gf/cm or less. Thereby, stability of the inlay may be improved.

According to a further embodiment, the inlay further comprises an at least partial coating, in particular a surface finish, arranged on at least one main surface of the gas-permeable porous layer structure. This measure may provide a protection to the porous layer structure, in particular in case the inlay is surface mounted or only partially embedded in a component carrier.

The coating (surface finish layer structure) may be arranged at an outer main surface of the inlay. In an embodiment, the coating may be arranged (directly) on the porous layer structure. Hereby, there may be no (lower) layer structure attached to the porous layer structure and the porous layer structure may only comprise an upper layer structure and an upper metal layer structure (see, e.g., FIG. 3F).

According to a further embodiment, the lower layer structure comprises a different size and/or shape compared to the upper layer structure. Thereby, many advantages design options are provided. For example, the layer structures may be patterned (in particular at the exposed region) in a different manner, or only one of the layer structures may be patterned. In another example, the thickness or length/width of the layer structures may be (at least partially) different.

According to a further embodiment, the lower layer structure comprises a horizontal offset with respect to the upper layer structure. This measure may be a specific case of the lower layer structure and the upper layer structure having a different size and/or shape. Specific functionalities may be achieved by providing differences in the horizontal direction (along an x-y plane).

According to a further embodiment, the cavity or the further cavity comprises a cylindrical or parallelepiped shape. Depending on the desired applications, specific functionalities may be achieved.

According to a further embodiment, the cavity comprises a sub-structure, in particular a patterned sub-structure, of the upper layer structure. According to a further embodiment, the further cavity comprises a further sub-structure, in particular a patterned sub-structure, of the lower layer structure. Depending on the desired applications, specific functionalities may be achieved.

According to a further embodiment, the inlay further comprises a lower metal layer structure, arranged below the lower dielectric layer structure. In this configuration, the layer structures and the porous layer structure may be sandwiched between two metal layers. This may provide robustness and an efficient interconnection with a component carrier.

According to a further embodiment, the upper metal layer and/or the lower metal layer comprises a metal layer cavity, configured so that a part of the gas-permeable porous layer structure is exposed. While in one example, the metal layer structures may cover the exposed part (at least temporarily, e.g., during transportation of the inlay), metal cavities may be provided to fully expose the exposed region. This exposure may be necessary for a plurality of applications.

According to a further embodiment, the metal layer cavity comprises a tapering sidewall. This structural feature may reflect a manufacture step of the cavity using laser drilling. In another example, the metal layer cavity may comprise (essentially) straight/vertical sidewalls, which may reflect a manufacture step of, e.g., mechanical drilling.

According to a further embodiment, the metal layer cavity is larger, in particular comprises a larger diameter, than the cavity and/or the further cavity. Yet, in another embodiment, the (further) cavity may be larger than the (further) metal cavity.

According to a further embodiment, the lower layer structure and/or the higher layer structure comprises conductive connection structures, in particular pads. Thereby, an efficient electrical connection of the inlay may be enabled.

According to a further embodiment, the inlay (or the component carrier) comprises a (electronic) component, in particular a semiconductor chip, which is (electrically) connected to at least one of the conductive connection structures (pads). In an example (see, e.g., FIG. 3F), the inlay comprises an electronic component which is in particular electrically connected to the inlay. Thus, the inlay may be configured as an electronic module.

According to a further embodiment, the upper metal layer structure and/or the lower metal layer structure is a continuous layer above the cavity and/or the further cavity. In this configuration, the porous layer structure may be efficiently protected, e.g., during transportation.

According to a further embodiment, the cavity and/or the further cavity comprises sidewalls that are essentially not tapering (i.e., are (essentially) vertical/straight). This structural feature may reflect a manufacture step of not using laser drilling, but e.g., mechanical drilling and/or etching.

According to a further embodiment, a thickness of the upper metal layer structure and/or the lower metal layer structure is larger than a thickness of the upper dielectric layer structure and/or the lower dielectric layer structure. Depending on the desired application, the configuration may also be the other way around.

According to a further embodiment, the gas-permeable porous layer structure is configured as a membrane.

According to a further embodiment, the gas-permeable porous layer structure comprises a non-woven material.

According to a further embodiment, the gas-permeable porous layer structure is configured translucent or opaque.

According to a further embodiment, the gas-permeable porous layer structure comprises or consists of at least one material of the group consisting of an electrically conductive material and an electrically insulating material, in particular a high-performance plastic material, wherein more particularly the high-performance plastic material comprises at least one of the group consisting of polyethylene terephthalate, polyoxymethylene, polyamide, polyimide, polytrimethylene terephthalate, polyetherketone, polyetherketoneketoneketone, polyetherketone, ethylene tetrafluoroethylene, perfluoroalkoxy alkanes, fluorinated ethylene propylene, polytetrafluoroethylene, polyvinylidene fluoride, polyvinylidene difluoride, styrol polymerisate, polycarbonate, polyphenylene sulfide, polyethersulfone, polyphenylsulfone, polyisopren and polysulfone.

According to a further embodiment, the gas-permeable porous layer structure is water-impermeable. This may provide the advantage that electronic components and/or further parts of the component carrier may be protected from moisture.

According to a further embodiment, the gas-permeable porous layer structure comprises a core and a coating wherein the material of the core is different to the material of the coating.

According to a further embodiment, the gas-permeable porous layer structure comprises a treated surface.

According to a further embodiment wherein the gas-permeable porous layer structure comprises at least one of the following functionalities: anti-bacterial, hydrophobic, hydrophilic, anti-odor, pro-odor, guiding acoustic waves (e.g., by micro-structures on the surface).

In an embodiment, the porous layer structure is a single material layer. In such an embodiment, the (exposed) layer is made of a homogeneous material. This ensures homogeneous properties of the exposed layer as a whole.

In another embodiment, the porous layer structure comprises multiple sub-structures of different materials. In said embodiment, the exposed layer may have a heterogeneous material composition (for instance made of different layers, each having another material) which makes it possible to fine-tune or adjust the desired properties of the exposed layer. For instance, the exposed layer may be composed of multiple sublayers which may be stacked or sandwiched so as to form, together, the exposed layer.

In an embodiment, a thickness of the porous layer structure is in a range between 1 μm and 30 μm, in particular in a range between 3 μm and 7 μm.

According to a further embodiment, the component carrier further comprises an upper stack cavity, configured so that an upper part of the gas-permeable porous layer structure is exposed. According to a further embodiment, the component carrier further includes a lower stack cavity, configured so that a lower part of the gas-permeable porous layer structure is exposed. In this manner, the functionality of the inlay/membrane may be exploited, even though the inlay is embedded in (especially in a core layer) of the component carrier. In an embodiment, the inlay may protect specific region of the component carrier (in particular an electronic component) from water/moisture. Further, the inlay may be permeable for sound waves and thereby serve as part of an electroacoustic transducer or as a sensor.

Figure 5:
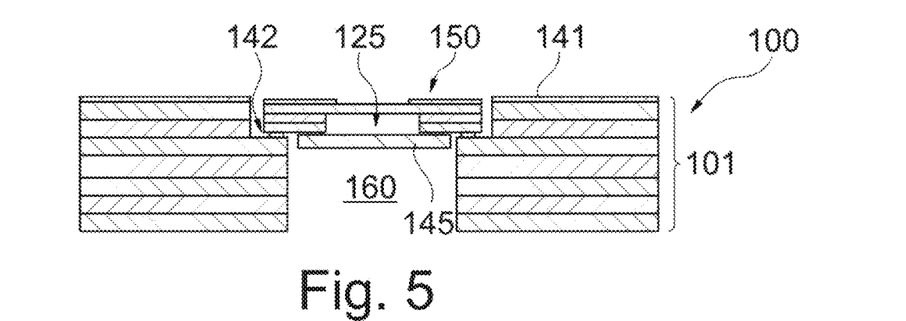
FIG. 5 illustrates a cross-sectional view of a respective component carrier with the inlay according to a further exemplary embodiment of the disclosure.
Figure 6:
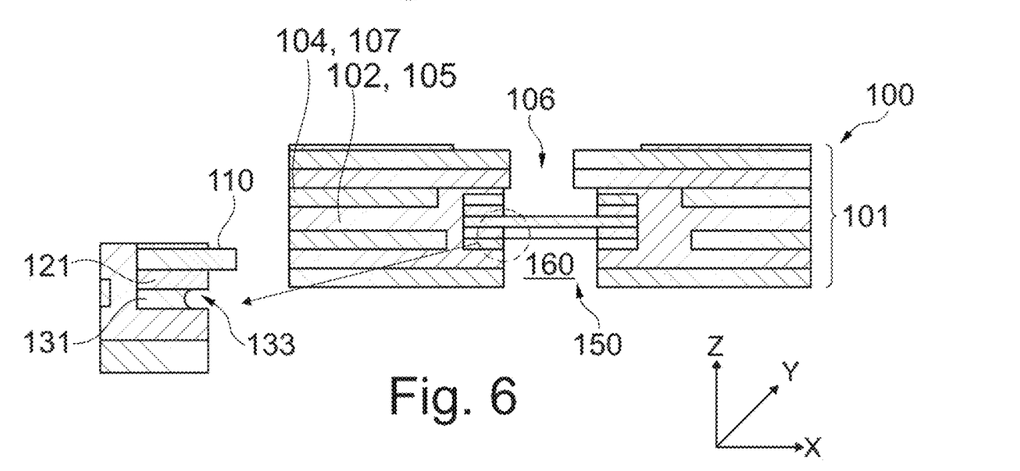
FIG. 6 illustrates a cross-sectional view of a respective component carrier with the inlay according to a further exemplary embodiment of the disclosure.

According to a further embodiment, the upper stack cavity or the lower stack cavity is formed as a component carrier hole (being a blind hole or a through hole), in particular a through hole having at least one stepped sidewall. An example of the latter is shown in FIGS. 5 and 6. In an example, the sidewall comprises at least one step that may serve as a protection for the embedded inlay or even as a platform to place at least a part of the inlay thereon.

According to a further embodiment, the upper layer structure and/or the lower layer structure is connected to the electrically conductive layer structure by one or more pads. Thus, a reliable and efficient electrical connection between inlay (and/or an electronic component of the inlay) and the component carrier may be established.

According to a further embodiment, the component carrier further comprises a component, and a through hole or a blind hole (being a component carrier hole), wherein the component is arranged at least partially within the through hole or the blind hole, in particular mounted on the bottom of the blind hole. In addition to the inlay, an electronic component may be combined with the component carrier in a design-flexible manner.

Figure 4:
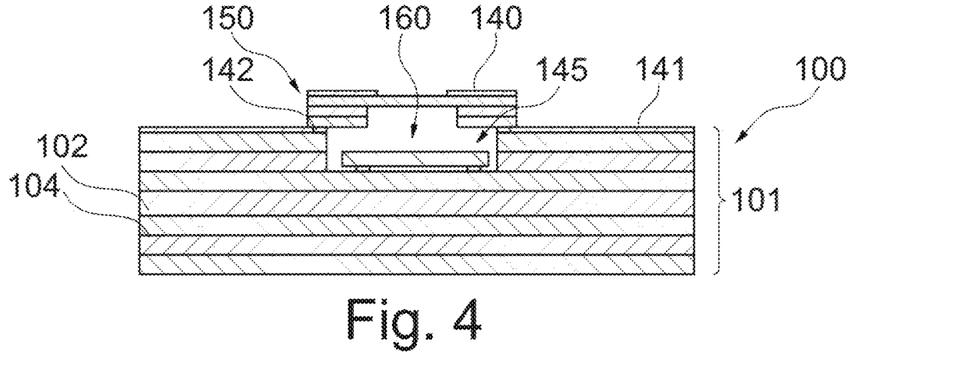
FIG. 4 illustrates a cross-sectional view of a respective component carrier with the inlay according to a further exemplary embodiment of the disclosure.

According to a further embodiment, the through hole or the blind hole is circumferentially closed, in particular fluid-tight closed, by the inlay. An example embodiment is shown in FIG. 4. When the electronic component is placed in a component carrier cavity, the inlay may be applied to cover the cavity and/or the electronic component. Thus, the functionality of the inlay may be combined with a protection for the embedded component. In a further embodiment, the component may be encapsulated (e.g., in resin) within the hole.

According to a further embodiment, the stack comprises a (central) core layer structure, and the inlay is embedded at least partially in the core layer structure. The core layer structure may comprise an electrically insulating material (typical PCB material) and/or an electrically conductive material (e.g., a copper or aluminum core). In case of an insulating material such as resin, preferably a (fully) cured resin may be applied. Embedding (at least partially) the inlay in the core layer structure may provide an especially robust build-up. In an example, a cavity may be formed in the core layer structure and the inlay is placed into said cavity.

According to a further embodiment, the component carrier further comprises an adhesive material, in particular an adhesion promoter, at least partially arranged between the inlay and the stack. The adhesive material may comprise a PCB material, for example one of uncured resin, prepreg, polyimide, or ABF. Thereby, a stable and reliable interface between inlay and stack may be provided.

According to a further embodiment, the component carrier is configured as at least one of an electroacoustic transducer (in particular one of an acoustic emitter or transmitter, e.g., a microphone), a sensor (in particular one of a pressure sensor, an acceleration sensor, a gas sensor), an actuator (in particular an acoustic receiver, e.g., a loudspeaker), a microelectromechanical system. In a further example, the gas-permeable porous layer structure forms a functional diaphragm and/or a sensor in the stack.

In an embodiment, the component carrier is configured as sensor (in particular one of an acoustic emitter, a pressure sensor, a moisture sensor, an acceleration sensor, and a gas sensor), an actuator (in particular an acoustic receiver) or a microelectromechanical system (MEMS). In the context of such applications, the exposed (porous) layer may be the functionally active constituent.

In an embodiment, the exposed (porous) layer forms a functional diaphragm (which may be denoted alternatively as a functional layer of diaphragm or partition structure, in particular ultra-sensitive partition structure). When embodied as a functional diaphragm, the exposed layer may be configured and enabled to freely oscillate or move in its exposed portion within the volumes delimited by the opposing blind holes. Such a freely oscillating functional diaphragm may be advantageous for functions such as sensor or electroacoustic applications (for instance when the component carrier functions as an acoustic emitter) and for actuating functions (for instance when the component carrier functions as an acoustic receiver). In an example, the porous layer structure may be configured to simultaneously form an acoustic transmitter and acoustic receiver.

According to a further embodiment, the layer structure is provided by at least one of the group, which consists of ink jetting, 3D-printing, paste-printing, spraying, curtain coating, spin coating, as a sheet.

According to a further embodiment, forming the cavity comprises photolithography, in particular electromagnetic wave (e.g., UV) irradiation, and/or etching.

According to a further embodiment, the method further comprises forming a metal layer cavity in the upper metal layer, in particular by laser processing and/or or etching.

Hence, established PCB manufacture methods may be directly implemented.

According to a further embodiment, the cavity is formed before the metal layer cavity is formed. In this example, the metal layer structure may serve as a protection for the exposed region and may be removed afterwards, e.g., after assembling the inlay to the component carrier. According to a further embodiment, the cavity is formed after the metal layer cavity is formed. In this example, the cavity may be formed directly through the metal layer structure and the upper/lower layer structure.

According to a further embodiment, the method further comprises forming an upper (lower) stack cavity, so that an upper (lower) part of the gas-permeable porous layer structure is exposed, in particular wherein forming the upper (lower) stack cavity is subsequent to forming the cavity. Thus, the inlay with the cavity is assembled to the component carrier during the layer build-up (lamination), and only afterwards, the stack cavity is formed to expose the inlay and further the porous layer structure.

According to a further embodiment, the method further comprises: i) laminating at least one further electrically conductive layer structure and/or at least one further electrically insulating layer structure before forming the upper stack cavity, and ii) removing the upper metal layer structure and/or the lower metal layer structure of the inlay at least partially by etching. In this example (see, e.g., FIG. 6), the inlay is (in particular edge portions of the inlay are) embedded in component carrier material (in particular in the sidewalls of a component carrier hole), which architecture may be obtained by placing the inlay into the layer stack during layer build-up (lamination). The inlay may be embedded and (at least partially) exposed later-on. For example, the metal layer structure(s) may protect the exposed region (see, e.g., FIG. 1) and is (at least partially) removed in a subsequent exposing step. As described above, removing metal material by etching may result in an indentation of the remaining metal layer structure(s).

In an embodiment, at least one metal layer structure within the stack (in particular being part of the inlay) has an indentation (at an inner sidewall of the stack). Such an indentation may be the fingerprint of an advantageous manufacturing method including etching (or laser processing), as described below. In an embodiment, the metal layer structure (and the indentation) are at least partially covered by a surface finish layer structure.

In an embodiment, the inlay comprises a surface finish, in particular (directly) on one (e.g., the lower) main surface of the porous layer structure. In this example, the upper main surface may be covered with the upper layer structure and the metal layer structure, while the lower main surface is covered by the surface finish. The surface finish may hereby comprise a cavity to partially expose the lower main surface. In this manner, the porous layer structure may be efficiently protected, while space (in particular along the z-direction) and further materials are saved.

In an embodiment, the sidewall(s) of the (upper/lower) layer structure in the (further) cavity are (essentially) straight/vertical or tapering.

In an embodiment, the sidewall(s) of the (upper/lower) metal layer structure in the (further) metal cavity are (essentially) straight/vertical or tapering. These structural features may reflect the manufacturing steps of e.g., etching, laser drilling, mechanical drilling, photolithography.

In an embodiment, the porous layer is impermeable to certain material e.g., liquid water, however, it is permeable when exposed to physical pressure. Therefore, components which interact with pressure changes may be placed on one side of the porous layer, e.g., a pressure sensor such as a piezo element. Said piezo element may be able to convert pressure into a voltage/potential which may be useful for specific applications.

In the context of this document, a connection structure may comprise at least one of a pad, a solder ball, a pillar, a sinter material. A connection structure may be configured to mechanically and electrically connect electrically conductive structures/layers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a bare die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g., based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties, e.g., FR4 or FR5, which describe their flame-retardant properties. Although prepreg particularly FR4 are usually preferred for rigid PCBs, other materials, in particular epoxy-based build-up materials (such as build-up films) or photoimageable dielectric materials, may be used as well. For high-frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular materials coated with a supra-conductive material or conductive polymers, such as graphene or poly (3,4-ethylenedioxythiophene) (PEDOT), respectively.

At least one component may be embedded in the component carrier and/or may be surface mounted on the component carrier. Such a component can be selected from a group consisting of an electrically non-conductive inlay, an electrically conductive inlay (such as a metal inlay, preferably comprising copper or aluminum), a heat transfer unit (for example a heat pipe), a light-guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as a component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable.

A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above and further aspects of the disclosure are apparent from the examples of embodiment to be described hereinafter and are explained with reference to these examples of embodiment.

DETAILED DESCRIPTION OF ILLUSTRATED EMBODIMENTS

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the disclosure have been developed.

According to an exemplary embodiment, an objective is to embed a component, e.g., consisting of PTFE membrane and copper termination, into a PCB. Within the component, a copper foil is attached to the membrane using a bondply material. The component will then be embedded. As to make the PTFE membrane accessible to the surrounding, an air cavity will be cut using a laser and the copper termination of the component will be etched. The membrane should be air-permeable and water-impermeable. Therefore, the bondply material needs to have an opening at the position of the air cavity.

Figure 1:
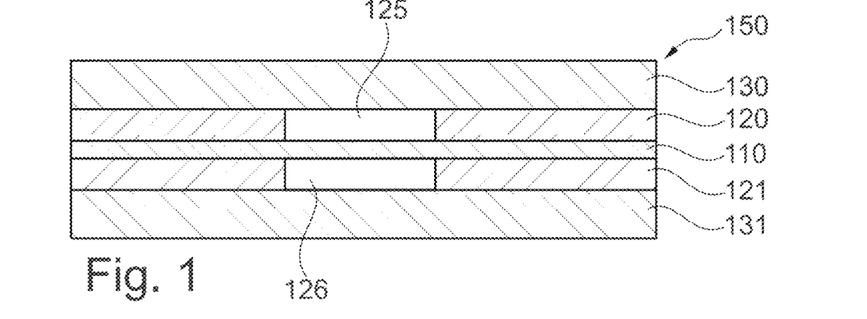
FIG. 1 illustrates a cross-sectional view of an inlay according to an exemplary embodiment of the disclosure.

FIG. 1 illustrates a cross-sectional view of an inlay 150 according to an exemplary embodiment of the disclosure. The inlay 150 comprises a gas-permeable and water impermeable porous layer structure 110 configured as a Teflon® membrane sandwiched between an upper layer structure 120 and a lower layer structure 121. Teflon® is a registered mark of The Chemours Company FC LLC of Wilmington, Delaware, U.S.A. In this example, the layer structures 120, 121 are dielectric and comprise a PID material. The layer structures 120, 121 are arranged directly on the gas-permeable porous layer structure 110, but comprise respective cavities 125, 126 that expose an upper part of the gas-permeable porous layer structure 110 at the bottom of the cavity 125 and a lower part of the gas-permeable porous layer structure 110 at the top of the further cavity 126. The exposed parts are arranged directly on opposed main surfaces of the gas-permeable porous layer structure 110. It can be seen that the exposed regions are smaller than the covered regions of the gas-permeable porous layer structure 110, thereby an efficient protection can be provided.

The inlay 150 further comprises an upper metal layer structure 130 and a lower metal layer structure 131 that sandwich the gas-permeable porous layer structure 110 and are arranged on the upper layer structure 120 and below the lower layer structure 121, respectively. In this example, the metal layer structures 130, 131 are configured as continuous copper foils that fully cover the dielectric layer structures 120, 121 and the cavities 125, 126. To produce this embodiment, the cavities 125, 126 are manufactured in the first place (e.g., by photolithography) and are then covered by the metal layer structures.

Figure 2:
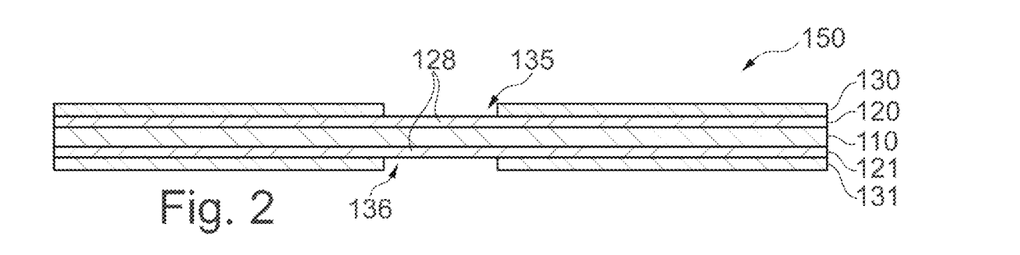
FIG. 2 illustrates a cross-sectional view of an inlay according to a further exemplary embodiment of the disclosure.

FIG. 2 illustrates a cross-sectional view of an inlay 150 according to a further exemplary embodiment of the disclosure. This inlay 150 is a semi-finished product, where the gas-permeable porous layer structure 110 has not yet been exposed and is still fully covered by the upper layer structure 120 and the lower layer structure 121. In contrast to the example shown in FIG. 1, the upper metal layer structure 130 and the lower metal layer structure 131 are not continuous, but a respective metal cavity 135, 136 has been formed, e.g., by etching, to expose the dielectric layer structures 128 below. Alternatively, the upper layer structure 120 and/or the lower layer structure 121 may not be exposed and developed and therefore could also act as additional porous layer structures. In other words, the thickness of the porous layer structure can thus be enlarged in the stack thickness direction (z).

FIG. 3A, FIG. 3B, FIG. 3C, FIG. 3D, FIG. 3E, and FIG. 3F illustrate a manufacturing process of an inlay 150 according to an exemplary embodiment of the disclosure.

Figure 3A:
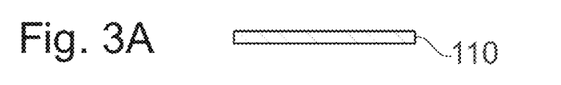
FIG. 3A, FIG. 3B, FIG. 3C, FIG. 3D, FIG. 3E, and FIG. 3F illustrate a manufacturing process of an inlay according to an exemplary embodiment of the disclosure.

In FIG. 3A the gas-permeable porous layer structure 110 is provided.

Figures 3B, 3C:
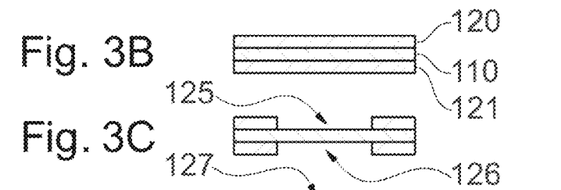

In FIG. 3B an upper layer structure 120 is arranged on top and a lower layer structure 121 is arranged below the gas-permeable porous layer structure 110.

As shown in FIG. 3C a cavity 125 is formed in the upper layer structure 120, thereby exposing the upper main surface of the gas-permeable porous layer structure 110, and a further cavity 126 is formed in the lower layer structure 121, thereby exposing the lower main surface of the gas-permeable porous layer structure 110.

Figure 3D:
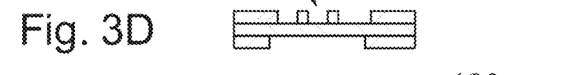

In FIG. 3D alternatively, only a part of the upper layer structure 120 is removed (in other words, the upper layer structure 120 is patterned) at the upper exposed region, leaving behind sub-structures or a patterned upper layer structure 127 of the upper layer structure 120. It can be further seen that the lower layer structure 121 comprises a horizontal offset with respect to the upper layer structure 120.

Figure 3E:
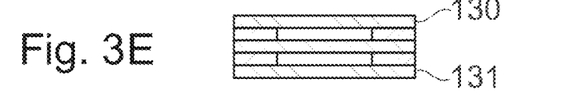

As illustrated in FIG. 3E an upper metal layer structure 130 is placed as a continuous layer on the upper layer structure 120, thereby covering the cavity 125, and a lower metal layer structure 131 is placed as a continuous layer below the lower layer structure 121, thereby covering the further cavity 126.

Figure 3F:
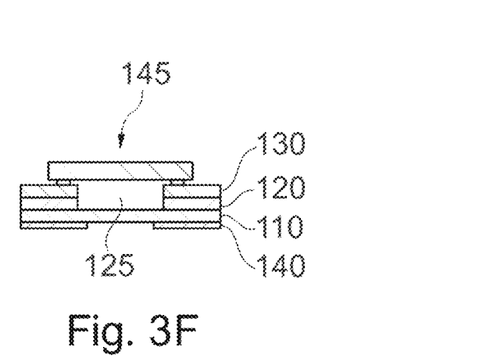

FIG. 3F shows an alternative embodiment, wherein the upper main surface of the gas-permeable porous layer structure 110 is exposed and an electronic component 145 is surface mounted to the inlay 150, thereby covering the cavity 125. At the lower main surface of the gas-permeable porous layer structure 110, there is no lower layer structure 121 in this example, but instead there is arranged a surface finish layer structure 140. In particular, the surface finish 140, is arranged like a coating on the lower main surface of the gas-permeable porous layer structure 110.

FIG. 4 illustrates a cross-sectional view of a component carrier 100 with the inlay 150 according to a further exemplary embodiment of the disclosure. In this example, a component carrier hole 160 is formed as a blind hole in an upper region of the stack 101 (the stack 101 comprising electrically insulating layer structures 102 and electrically conductive layer structures 104, as well as via interconnections (not shown)). An electronic component 145 has been placed at the bottom of the component carrier blind hole 160 and is electrically connected to the stack 101. The inlay 150 (as described for example in FIG. 3F) is surface mounted to the stack 101 directly above the component carrier blind hole 160 in order to cover said hole 160 and the embedded electronic component 145. The gas-permeable porous layer structure 110 is hereby arranged directly above the electronic component 145 with no further structure in between. The upper metal layer structure 130 is in this example arranged at the lower side of the flipped inlay 150 and is electrically connected to the layer stack 101 via connection structures such as pads 142. Besides the pads 142, the layer stack 101 comprises a surface finish layer structure 141 as a coating. Due to the inlay surface finish layer structure 140, the inlay 150 upper main surface is also protected. In an example, the inlay 150 is electrically connected via the stack 101 to the embedded component 145.

FIG. 5 illustrates a cross-sectional view of a component carrier 100 with the inlay 150 according to a further exemplary embodiment of the disclosure. In this example, a component carrier hole 160 is formed as a through hole that extends through the layer stack 101. Yet, in an upper region of the stack 101, the through hole 160 comprises a wider diameter than in a lower region of the stack 101. The interface between upper region and lower region of the through hole 160 results therefore in a stepped sidewall. Said step is further used as a platform for placing the inlay 150. Again, the inlay 150 of FIG. 3F is applied and it is placed on the step so that only an edge region of the inlay 150 is positioned on the step. Said edge region comprises the pad 142 at the lower surface and the pad 142 is electrically connected to an electrically conductive layer structure of the stack 101.

Since exactly the same inlay 150 as described for FIG. 3F is used, the electronic component 145 is connected through further pads to the upper metal layer structure 130 of the inlay 150. By arranging the inlay 150 in a flipped position in the through hole 160, the electronic component 145 is arranged in the lower region of the through hole 160. In an embodiment, the electronic component 145 is electrically connected via the inlay 150 to the layer stack 101. The surface finish 140 of the inlay 150 can be position essentially in line with the surface finish of the component carrier 141, thereby providing efficient surface protection.

FIG. 6 illustrates a cross-sectional view of a component carrier 100 with the inlay 150 according to a further exemplary embodiment of the disclosure. Also in this example, the component carrier hole 160 is configured as a through hole. In contrast to FIG. 5, the upper part of the through hole 160 is narrower than the lower part. The inlay 150 is not positioned on a step but rather, the side parts of the inlay 150, where the gas-permeable porous layer structure 110 is not exposed, are embedded in the stack 101. This embodiment can for example be manufactured by arranging the inlay 150 in the component carrier 100 during the layer stack build-up process.

In particular, the metal layer structures 130, 131 can be provided as continuous layers like in FIG. 1. Then, during component carrier manufacturing, the gas-permeable porous layer structure 110 can be fully exposed by removing the metal layer structures 130, 131 only above and below the exposed region. Removing can be done by etching, which leads to an indentation (see detailed view) of the metal layer structures 130, 131, wherein the indentation 133 can also be detectable in a final component carrier product. The metal layer structure 131 and/or the indentation 133 can be at least partially covered by a surface finish layer structure.

It should be noted that the term "comprising" does not exclude other elements or steps and the article "a" or "an" does not exclude a plurality. Also, elements described in association with different embodiments may be combined.

Implementation of the disclosure is not limited to the preferred embodiments shown in the figures and described above. Instead, a multiplicity of variants is possible which variants use the solutions shown and the principle according to the disclosure even in the case of fundamentally different embodiments.

REFERENCE SIGNS 100 component carrier
101 stack
110 gas-permeable porous layer structure
120 upper dielectric layer structure
121 lower dielectric layer structure
125 cavity
126 further cavity
127 patterned upper layer structure
128 exposed part
130 upper metal layer structure
131 lower metal layer structure
133 indentation
135 metal cavity
136 further metal cavity
140 surface finish (layer structure)
141 component carrier surface finish
142 connection structure, pad
145 electronic component
150 inlay
160 component carrier through/blind hole

The invention claimed is:

1. An inlay for a component carrier, the inlay comprising:
a gas-permeable porous layer structure;
an upper layer structure, arranged on the gas-permeable porous layer structure,
wherein the upper layer structure comprises a cavity, configured so that an upper part of the gas-permeable porous layer structure is exposed; and
an upper metal layer structure, arranged on the upper layer structure;
wherein the upper metal layer comprises a metal layer cavity configured such that a part of the gas permeable porous layer structure is exposed.

2. The inlay according to claim 1, further comprising:
a lower layer structure arranged below the gas-permeable porous layer structure,
wherein the lower layer structure comprises a further cavity, configured Se such that a lower part of the gas-permeable porous layer structure is exposed.

3. The inlay according to claim 1,
wherein the upper layer structure and/or the lower layer structure comprises a photo-imageable material and/or a nanoimprint photolithography resist.

4. The inlay according to claim 3,
wherein the photo-imageable material comprises a photo-imageable dielectric material; and/or
wherein the photo-imageable dielectric material comprises advanced adhesion properties; and/or
wherein the photo-imageable dielectric material comprises a polymer; and/or
wherein the photo-imageable dielectric material comprises additives; and/or
wherein the photo-imageable dielectric material is configured as a highly temperature stable material; and/or
wherein the photo-imageable dielectric material is sensitive to UV radiation; and/or
wherein the photo-imageable dielectric material comprises a negative or positive charged material; and/or
wherein the photo-imageable dielectric material comprises a peel strength of 200 gf/cm or more; and/or
wherein the photo-imageable curing temperature is in the range 100° C. to 300° C.

5. The inlay according to claim 1, further comprising:
an at least partial coating arranged on at least one main surface of the gas-permeable porous layer structure.

6. The inlay according to claim 2,
wherein the lower layer structure comprises a different size and/or shape compared to the upper layer structure; and/or wherein the lower layer structure comprises a horizontal offset with respect to the upper layer structure; and/or wherein the cavity or the further cavity comprises a cylindrical or parallelepiped shape; and/or wherein the cavity comprises a patterned sub-structure of the upper layer structure.

7. The inlay according to claim 2, further comprising:
a lower metal layer structure, arranged below the lower layer structure.

8. The inlay according to claim 1,
wherein the metal layer cavity comprises a tapering sidewall; and/or
wherein the metal layer cavity has a larger diameter than the cavity.

9. The inlay according to claim 2,
wherein the lower layer structure and/or the upper layer structure comprises conductive connection structures, wherein an electronic component is connected to at least one of the conductive connection structures.

10. The inlay according to claim 2,
wherein the upper metal layer structure and/or the lower layer structure is a continuous layer above the cavity and/or the further cavity; and/or
wherein the cavity and/or the further cavity comprises sidewalls that are essentially not tapering.

11. The inlay according to claim 1,
wherein the gas-permeable porous layer structure is configured as a membrane; and/or
wherein the gas-permeable porous layer structure comprises a non-woven material; and/or
wherein the gas-permeable porous layer structure is configured translucent or opaque; and/or
wherein the gas-permeable porous layer structure is water-impermeable; and/or
wherein the gas-permeable porous layer structure comprises a core and a coating, wherein the material of the core is different to the material of the coating; and/or
wherein the gas-permeable porous layer structure comprises a treated surface, wherein the gas-permeable porous layer structure comprises at least one of the following functionalities: anti-bacterial, hydrophobic, anti-odor, pro-odor.

12. The inlay according to claim 1,
wherein the gas-permeable porous layer structure comprises at least one material of the group consisting of an electrically conductive material and an electrically insulating material, a high-performance plastic material, wherein the high-performance plastic material comprises at least one of the group consisting of polyethylene terephthalate, polyoxymethylene, polyamide, polyimide, polytrimethylene terephthalate, polyetheretherketone, polyetherketonetherketoneketone, polyetherketone, ethylene tetrafluoroethylene, perfluoroalkoxy alkanes, fluorinated ethylene propylene, polytetrafluoroethylene, polyvinylidene fluoride, polyvinylidene difluoride, styrol polymerisate, polycarbonate, polyphenylene sulfide, polyethersulfone, polyphenylsulfone, polyisopren and polysulfone.

13. A component carrier, comprising:
a stack comprising at least one electrically conductive layer structure and at least one electrically insulating layer structure; and
an inlay including:
a gas-permeable porous layer structure;
an upper layer structure, arranged on the gas-permeable porous layer structure, wherein the upper layer structure comprises a cavity, configured se such that an upper part of the gas-permeable porous layer structure is exposed;
an upper metal layer structure, arranged on the upper layer structure;
an upper stack cavity configured such that an upper part of the gas permeable porous layer structure is exposed;
wherein the inlay is assembled to the stack.

14. The component carrier according to claim 13, further comprising:
a lower stack cavity configured such that a lower part of the gas-permeable porous layer structure is exposed; and/or
wherein the upper stack cavity or lower stack cavity is formed as a component carrier hole being a blind hole or through hole,
a through hole having at least one step-shaped sidewall; and/or
wherein the upper layer structure and/or the lower layer structure is connected to the electrically conductive layer structure by one or more pads; and/or
further comprising:
an electronic component, and
the component carrier hole, being a through hole or a blind hole, wherein the electronic component is arranged at least partially within the through hole or the blind hole,
mounted on the bottom of the blind hole,
wherein the through hole or the blind hole is circumferentially closed by the inlay; and/or
wherein the stack comprises a core layer structure, and
wherein the inlay is embedded at least partially in the core layer structure; and/or
further comprising:
an adhesive material at least partially arranged between the inlay and the stack.

15. A method of manufacturing an inlay for a component carrier, the method comprising:
providing a gas-permeable porous layer structure;
arranging a layer structure on the gas-permeable porous layer structure;
forming a cavity in the layer structure, thereby exposing an upper part of the gas-permeable porous layer structure;
arranging a metal layer structure on the layer structure; and
forming a metal layer cavity in the metal layer such that a portion of the gas permeable porous layer structure is exposed.

16. The method according to claim 15,
wherein the layer structure is provided by at least one of the group consisting of ink jetting, 3D-printing, paste-printing, spraying, curtain coating, spin coating, as a sheet; and/or
wherein forming the metal layer cavity comprises photolithography and/or etching; and/or
the method further comprising:
forming the metal layer cavity in the metal layer structure by laser processing and/or or etching; and/or
wherein the cavity in the layer structure is formed before the metal layer cavity is formed; or
wherein the cavity in the layer structure is formed after the metal layer cavity is formed.

17. A method of manufacturing a component carrier, the method comprising:
- forming a stack comprising at least one electrically conductive layer structure and at least one electrically insulating layer structure; and
- assembling an inlay to the stack, the inlay comprising:
- a gas-permeable porous layer structure;
- an upper layer structure, arranged on the gas-permeable porous layer structure,
- wherein the upper layer structure comprises a cavity, configured so that an upper part of the gas-permeable porous layer structure is exposed;
- an upper metal layer structure, arranged on the upper layer structure; and
- forming an upper stack cavity such that an upper part of the gas-permeable porous layer structure is exposed.

18. The method according to claim 17,
- wherein forming the upper stack cavity is subsequent to forming the cavity.

19. The method according to claim 17, further comprising:
- laminating at least one further electrically conductive layer structure and/or at least one further electrically insulating layer structure before forming the upper stack cavity, and
- removing the upper metal layer structure and/or the lower metal layer structure of the inlay at least partially by etching.

* * * * *

UNITED STATES PATENT AND TRADEMARK OFFICE
CERTIFICATE OF CORRECTION

| | |
|---|---|
| PATENT NO. | : 12,484,154 B2 |
| APPLICATION NO. | : 18/188401 |
| DATED | : November 25, 2025 |
| INVENTOR(S) | : Stefanie Paller and Gernot Grober |

It is certified that error appears in the above-identified patent and that said Letters Patent is hereby corrected as shown below:

In the Claims

In Column 18, Line 36, after "configured", delete "Se".

Signed and Sealed this
Twenty-seventh Day of January, 2026

John A. Squires
*Director of the United States Patent and Trademark Office*